United States Patent [19]

Leas et al.

[11] Patent Number: 5,656,553
[45] Date of Patent: Aug. 12, 1997

US005656553A

[54] METHOD FOR FORMING A MONOLITHIC ELECTRONIC MODULE BY DICING WAFER STACKS

[75] Inventors: James Marc Leas; Steven Howard Voldman, both of South Burlington, Vt.

[73] Assignee: International Business Machines Corporation, Armonk, N.Y.

[21] Appl. No.: 655,529

[22] Filed: May 30, 1996

Related U.S. Application Data

[63] Continuation-in-part of Ser. No. 239,991, Aug. 22, 1994.
[51] Int. Cl.$^6$ ................................................. H01L 21/302
[52] U.S. Cl. .............................. 438/15; 438/109; 438/458
[58] Field of Search ................................... 437/226, 208, 437/915, 227

[56] References Cited

U.S. PATENT DOCUMENTS

| | | | |
|---|---|---|---|
| 4,646,128 | 2/1987 | Carson et al. | 357/74 |
| 4,770,640 | 9/1988 | Walter | 439/69 |
| 4,801,992 | 1/1989 | Golubic | 357/40 |
| 4,965,653 | 10/1990 | Otsuka et al. | 257/690 |
| 4,983,533 | 1/1991 | Go | 437/7 |
| 5,025,306 | 6/1991 | Johnson et al. | 357/75 |
| 5,075,253 | 12/1991 | Sliwa, Jr. | 257/723 |
| 5,104,820 | 4/1992 | Go et al. | 437/51 |
| 5,107,586 | 4/1992 | Eichelber et al. | 29/830 |
| 5,214,657 | 5/1993 | Farnworth et al. | 257/202 |
| 5,266,833 | 11/1993 | Capps | 257/690 |
| 5,478,781 | 12/1995 | Bertin et al. | 437/209 |
| 5,517,057 | 5/1996 | Beilstein, Jr. et al. | 257/686 |

OTHER PUBLICATIONS

Brown, Chet "New IC Stacking Process Ideal for High-Density Memory Module and Hybrid Applications," Proceedings of the Electro 1995 International Conference, pp. 3–16, Jun. 1995.

Maliniak, David "Memory-Chip Stacks Send Density Skyward," Electronic Design, pp. 60–74, Aug. 1994.

Brown, Chet "A New Vertical Interconnection Technique is Ideal for High Density Packaging," IC Card Systems & Design, 26–31, Sep./Oct. 1994.

Primary Examiner—R. Bruce Breneman
Assistant Examiner—Vanessa Acosta
Attorney, Agent, or Firm—Heslin & Rothenberg, P.C.

[57] ABSTRACT

A fabrication method and resultant monolithic electronic module comprising a plurality of stacked planar extending arrays of integrated circuit chips. The fabrication method includes dicing a wafer of integrated circuit chips into a plurality of arrays of integrated circuit chips. The arrays of integrated circuit chips are then stacked to form an electronic module. A metallization pattern may be deposited on a substantially planar surface of the electronic module, and used to interconnect the various arrays of integrated circuit chips contained therein. Specific details of the fabrication method and resultant multi-chip package are set forth.

16 Claims, 6 Drawing Sheets fig. 1 fig. 1a fig. 2 fig. 3 fig. 4 fig. 5 fig. 6 fig. 7a fig. 7b fig. 8

METHOD FOR FORMING A MONOLITHIC ELECTRONIC MODULE BY DICING WAFER STACKS

CROSS-REFERENCE TO RELATED APPLICATION

This is a continuation-in-part application from pending prior U.S. application Ser. No. 08/239,991, filed Aug. 22, 1994, and entitled "Three-Dimensional Monolithic Electronic Module Having Stacked Planar Arrays of Integrated Circuit Chips," which is assigned to the same assignee as the present application, and which is hereby incorporated herein by reference.

TECHNICAL FIELD

The present invention relates in general to high density electronic packaging which permits optimization of the number of circuit elements to be included in a given volume. More particularly, this invention relates to a technique for forming a monolithic electronic module by stacking arrays of integrated circuit chips. The resulting electronic module may be used as a single high density electronic module, or be subdivided into multiple electronic modules. The invention further relates to a technique for forming multiple monolithic electronic modules through dicing of a wafer stack.

BACKGROUND ART

Since the development of integrated circuit technology, computers and computer storage devices have been made from wafers of semiconductor material comprising a plurality of integrated circuits. After a wafer is made, the circuits are typically separated from each other by dicing the wafer into individual chips. Thereafter, the individual chips are bonded to carriers of various types, interconnected by wires and packaged. Such "two dimensional" packages of chips fail to optimize the number of circuits that may be fabricated in a given space, and also introduce undesirable signal delays, capacitance, and inductance as signals travel between chips. Recently, three-dimensional stacks of single chips have emerged as an important packaging approach. A typical multi-chip electronic module consists of multiple individual integrated circuit chips adhesively secured together as a monolithic structure (a "stack") extending in one direction as a single row or column. A metallization pattern is often provided directly on one (or more) side surface(s) of the module for chip interconnection and for electrical connection of chips to circuitry external to the module. Metallization patterns can include both individual contacts, and bussed contacts.

Volume production of electronic modules formed of stacks of individual integrated circuit chips has been limited by the high production costs associated therewith. The individual steps of dicing, stacking, and applying metallization are all relatively complex and expensive process steps in the formation of a monolithic electronic module. Furthermore, the overall level of circuit integration and density in an electronic module is necessarily limited in a stack of single integrated circuit chips extending in one-direction as a row or column.

DISCLOSURE OF THE INVENTION

Briefly described, the present invention comprises, in a first aspect, a novel process for forming an electronic module. The process includes providing a plurality of planar arrays, each planar array comprising multiple integrated circuit (IC) chips. A planar array is a single, substantially planar substrate with multiple IC chips disposed thereon and organized in a grid like (an array) manner. Next, the planar arrays are stacked to form an electronic module. As an enhancement, the planar arrays may be aligned such that the edge surfaces of the planar arrays at least partially define a side surface of the electronic module. As a further enhancement, a metallization pattern may be deposited on the substantially planar side surface of the electronic module, and used to at least partially electrically interconnect the planar arrays.

In another aspect, the present invention consists of an electronic module comprising a plurality of stacked planar arrays, each planar array having multiple IC chips. As one enhancement, each planar array has an edge surface, and these edge surfaces at least partially define a side surface of the electronic module. A metallization pattern is deposited on the side surface of the module, at least partially electrically interconnecting the planar arrays. In a further enhancement, each planar array has transfer metals extending to an edge surface. These transfer metals at least partially electrically attach to the metallization pattern.

In yet another aspect of the present invention, a method for forming a planar array for use in an electronic module (having a plurality of planar arrays) is disclosed. A wafer is provided having a plurality of IC chips. The wafer is then diced to form at least two planar arrays, each planar array having a plurality of IC chips. As an enhancement, before dicing the wafer, a dicing pattern may be determined, the dicing being performed according to the dicing pattern. The dicing pattern may be optimized in order to maximize a yield of planar arrays from the wafer.

In still another aspect, the present invention comprises a method for forming an electronic module by dicing a wafer stack. The method includes providing a plurality of wafers, each wafer having at least one planar array of multiple chips, the planar array having a predefined peripheral shape; forming a wafer stack by stacking the plurality of wafers so that the planar arrays of multiple chips which have the common peripheral shape aligned within the wafer stack; and dicing the wafer stack along the common, predefined peripheral shape to thereby form the electronic module. In a preferred embodiment, the common peripheral shape comprises a non-square rectangle, and the method further comprises applying an interconnect metallization on at least one side surface of the electronic module subsequent to dicing thereof from the wafer stack, and thereafter, further dicing the electronic module into sub-modules with each sub-module having at least one chip in each chip layer of the structure. Further process enhancements of this aspect of an electronic module fabrication method in accordance with the present invention are also described and claimed herein.

The present invention provides many advantages over existing technology. By forming electronic modules from planar arrays of IC chips, a higher level of integration is achieved over traditional single chip stacking technology.

Creating electronic modules out of planar arrays of multiple integrated circuit chips yields larger electronic modules than those based upon single chips. These larger modules have superior characteristics with respect to handling, processing, packaging and density. Thus, associated processes are simpler and less expensive. Furthermore, because a wafer is diced into planar arrays of multiple integrated circuit chips, the amount of wafer level dicing has been reduced, thereby simplifying overall wafer processing.

In the embodiment of the present invention in which an electronic module is fabricated and then subdivided into smaller electronic modules, the smaller electronic modules have been fabricated sharing common dicing, stacking and interconnecting (side surface metallization) processes. Thus, the overall fabrication complexity and costs associated with the resultant smaller electronic modules have been reduced as contrasted with individual fabrication.

These advantages are further magnified in the embodiment of the present invention wherein wafer-stacks are first created prior to dicing stacks of bar-shaped planar arrays from the wafer. By selecting high yielding wafers, with transfer wiring and polyimide already applied, the wafers can be aligned, stacked and cured in full wafer form prior to dicing into bar-shaped stacks. Side surface metallization processes can occur on a side face of the bar-shaped stacks, which may then be followed by further dicing into smaller electronic sub-modules. With this approach, fabrication complexity and the cost to produce an electronic module or sub-module is further reduced. The steps of stacking, aligning and curing all the chips of the wafers are accomplished at one time, for virtually the same cost as for producing a single stack having a single chip in each chip layer of the stack. The method also permits thinning of the wafers before stacking. Cost advantages of this process improve as wafer yield and wafer size continue to increase.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

Figure 1:
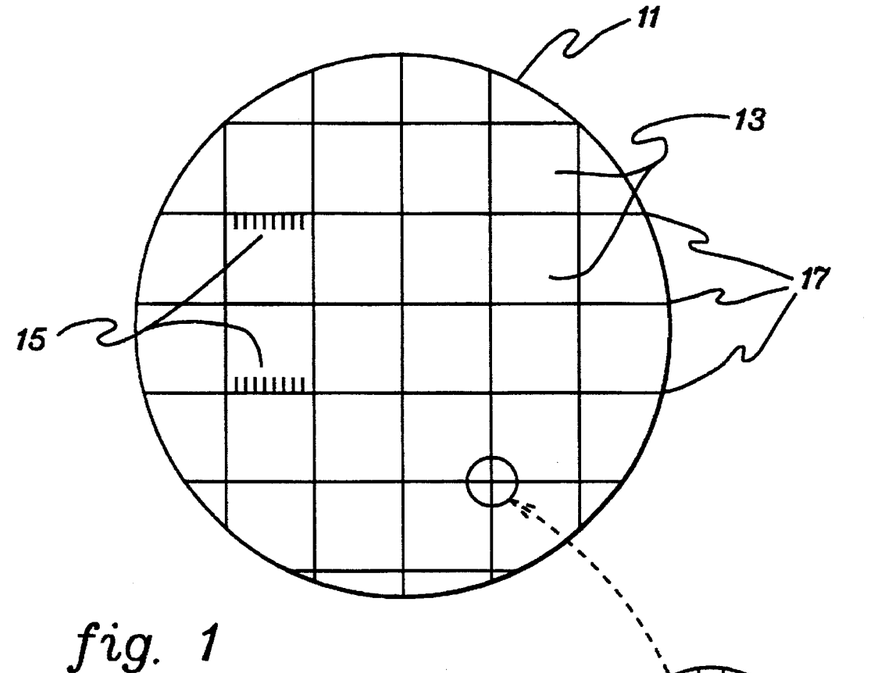
FIG. 1 is a top view of a wafer comprising a plurality of integrated circuit chips.

Certain preferred embodiments for forming an electronic module are presented herein. FIG. 1 is a top view of wafer 11 consisting of multiple integrated circuit (IC) chips 13 which are used in the formation of planar arrays of IC chips. Note, however, that the novel aspects of the present invention are not limited to stacking of IC chips. In particular, the stacking and module fabrication approach presented herein could be employed to form arrays and stacks of any type of chip known in the microelectronics art.

A planar array of IC chips is a single, substantially planar substrate containing multiple IC chips organized in a grid like (an array) manner. These planar arrays are then used in forming the electronic module of the present invention. Typical functions implemented by the integrated circuit chips may include, for example, memory, interface, processor and/or control functions. Again, however, each chip may include any function known in the art for implementation on a microelectronics chip. Fabrication of the wafer is performed by conventional techniques known in the art.

Figure 2:
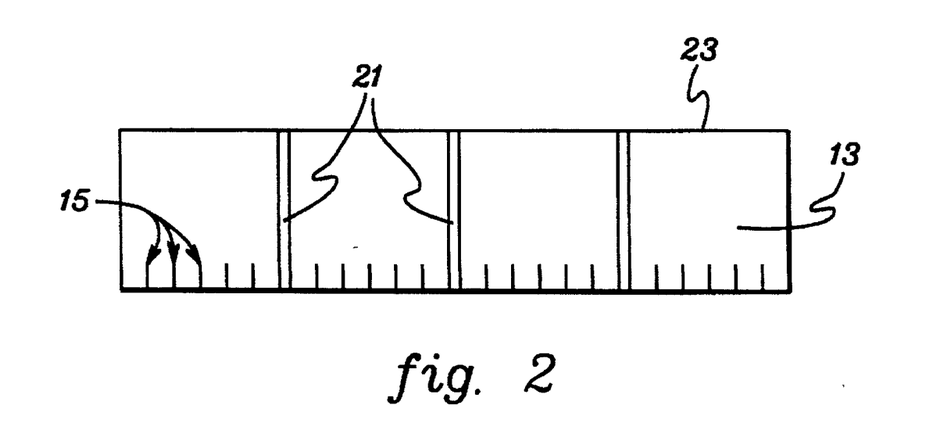
FIG. 2 is a top view of an array of integrated circuit chips formed by dicing the wafer of FIG. 1.

In accordance with the present invention, the wafer is first tested to determine which of the plurality of integrated circuit chips are functional. This step is necessary because some chips may exhibit defects, and their inclusion in the resulting electronic module of the present invention may be undesirable. In this regard, a "functional map" indicating functional and non-functional chips within the wafer is produced. This map is then utilized, together with information regarding the dimensions of the planar arrays of IC chips required (see, for example, the 1×4 array of FIG. 2), to produce a "dicing pattern" which indicates how the wafer is to be cut into individual planar arrays of IC chips.

Various manual and/or computer controlled methods may be used to determine a dicing pattern. As a particular process example, if a 1×4 (one chip by four chips) planar array is needed, contiguous linear groups of 4 functional chips are identified. Each group is then designated as part of the dicing pattern. It should be generally noted that each array within the wafer should be oriented in the same direction. That is, no two arrays should be positioned in a perpendicular direction to each other on the wafer. This is necessary to simplify the later process step of applying a transfer metallurgy layer to the wafer.

As an enhancement, an optimizing algorithm (i.e., clustering algorithm) may be used in reorganizing the dicing pattern to optimize the total yield of (e.g., 1×4) arrays from the wafer. For example, the algorithm could automatically calculate the preferred orientation of planar arrays on the wafer.

Continuing with the description of a preferred embodiment, once a "dicing pattern" is determined, locating each array on the wafer, appropriate transfer metallurgy (i.e. "transfer metals") (15) may be deposited on the wafer using conventional techniques. The transfer metals provide electrical connections from input/output pads (not shown) on the surface of each chip to an edge of the chip. The transfer metallurgy pattern is designed in conjunction with the dicing pattern so that the edges of the chips to which the transfer metals extend corresponds to an edge of the planar array containing the chips. Ultimately, this provides electrical connectivity from the side surface of a resulting electronic module (defined by the edge surfaces of the individual stacked planar arrays) to individual chips within the module.

Figure 1A:
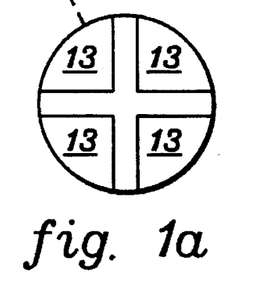
FIG. 1a is an enlarged plan view of a portion of the wafer of FIG. 1.

The wafer may then be diced according to the established dicing pattern along horizontal kerfs 17, comprising part of kerf region 21 (FIG. 1a) separating the chips, so as to form planar arrays of IC chips (as used herein, kerfs are the spaces or regions between individual chips in a wafer). As a specific example, shown in FIG. 2, linear array of IC chips 23 has been formed by dicing a wafer (11) into a 1×4 planar array of IC chips (13). Because the array is formed from a single wafer, it comprises a single, substantially planar piece of substrate (for example, silicon) with four IC chips formed thereon. Each IC chip includes transfer metals 15 extending towards an edge surface of the chip (hence, the edge of the array) for connection to external circuitry. The chips (13) are separated in the array by kerf region 21.

Figure 3:
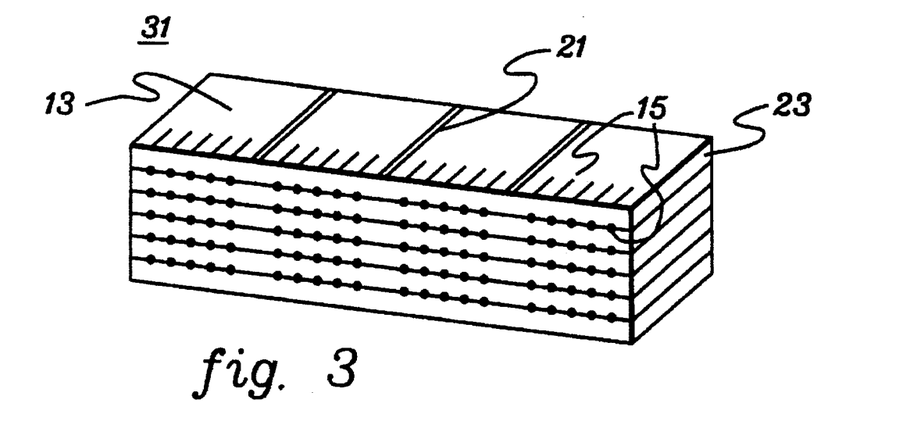
FIG. 3 is a perspective view of an electronic module of the present invention formed by stacking a plurality of arrays of integrated circuit chips of FIG. 2.

To proceed, in the preferred embodiment of the present invention, as shown in FIG. 3, a plurality of planar arrays of integrated circuit chips are stacked to form electronic module 31 (without side surface metallization). The stacking process may be performed in a manner similar to the forming of "single chip" based electronic modules. Planar arrays of IC chips generally have their active circuit layers protected by an insulator (not shown) that contains appropriate transfer metals. An adhesive (not shown) is applied to the surface of the insulator, and used to adjoin one array of integrated circuit chips to the back surface of the next array. Each array is thus bonded to an adjacent array forming a monolithic electronic module.

During the "stacking" process, the arrays are aligned such that the resultant electronic module has a substantially non-square, rectangular parallelepiped shape. This results in columnar alignment of IC chips (13) within adjacent arrays of the electronic module. Further, alignment of the edge surfaces of the arrays is achieved. Accordingly, a substantially planar side surface of the electronic module is defined by the plurality of edge surfaces.

In a further process step of the present invention, the substantially planar side surface of the module is etched and polished to expose the ends of the transfer metals (15). These transfer metals may be utilized to interconnect the various arrays, and/or connect the module to external circuitry.

Figure 4:
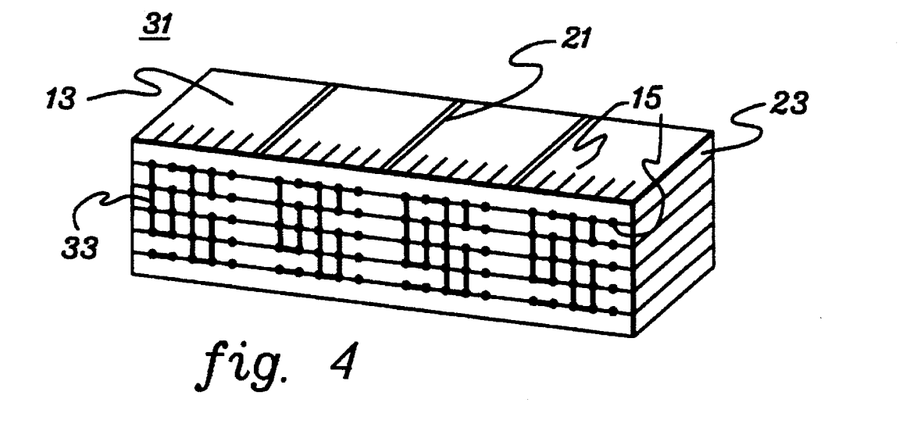
FIGS. 4-5 are perspective views of an electronic module with side surface metallization according to the present invention.
Figure 5:
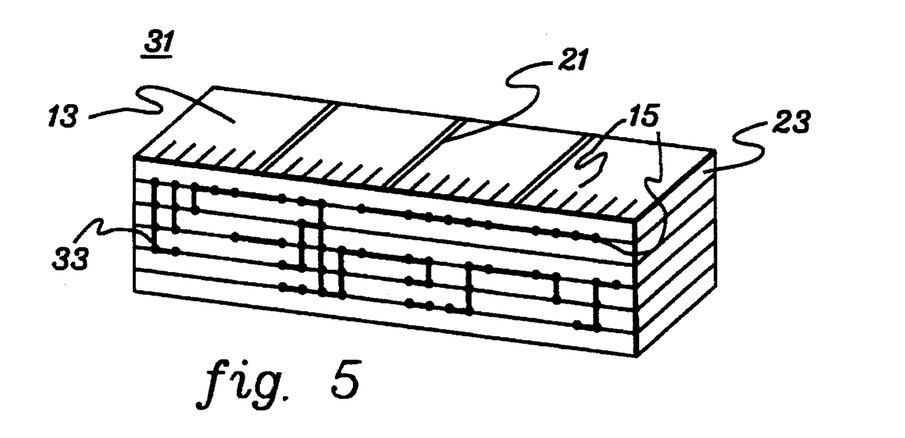

FIGS. 4 and 5 depict embodiments of the present invention in which side surface metallization 33 has been formed to interconnect the various chips contained in, and facilitate external electrical connection of, the module. In FIG. 4, each individual "chip column" composed of aligned IC chips in adjacent layers is treated as a separate electronic module. As shown, the side surface metallization contains the same interconnect pattern on each "chip column." This enables the electronic module, if separated along the kerfs between chips to form multiple "chip column" electronic modules with associated side surface metallization. Advantageously, each of the "chip column" modules is formed by a common dicing, stacking, and metallization process, thereby reducing overall costs.

As an enhancement, the electronic module of FIG. 4 may be divided into other variously dimensioned smaller electronic modules. For example, instead of dividing the electronic module into four "chip columns" as above, a 1×4 module could be divided into a 1×1 and a 1×3 module. Alternately, it could be divided into two 1×2 modules. The side metallization pattern applied would be tailored to the smaller modules formed. For example, if two 1×2 modules were to be formed from a 1×4 module, each 1×2 module would be identically and individually interconnected by the side metallization pattern applied to the 1×4 module.

In the embodiment of the present invention shown in FIG. 5, a side surface metallization is deposited interconnecting the entire "stack" of arrays as a single, very high density monolithic electronic module. There is no distinction of "chip columns" as described hereinabove. Signals from any IC chip within the module may be interconnected to signals from any other IC chip. This provides a gainful advantage in overall electronic module complexity and density.

In an alternative embodiment of the present invention, the dicing pattern may be purposefully designed to include non-working chips in the arrays. Non-working chips are included to optimize the yield of arrays from a given wafer. In that case, the functional map of the wafer is used to determine the functional/non-functional chips in each array (diced from the wafer). This information is then used when electrically interconnecting the chips in the array so as to functionally exclude non-working chips from the resultant electronic module.

Specifically, provisions are necessary to functionally remove the non-working chips from the encompassing electronic module. Accordingly, a side surface metallization pattern may be tailored to route signals away from non-working chips. Furthermore, if spare chips are included within the module, then the side surface metallization pattern may electrically (and functionally) replace the non-working chips with spares. Thus, a wafer may be more fully utilized in forming planar arrays by including non-working chips in the arrays, and electrically replacing (or excluding) the non-working chips at the module level. This technique circumvents restricting the dicing pattern so as to avoid including failed chips in the arrays, lowering the overall yield of arrays from the wafer.

In an alternate embodiment of the present invention, other dimensions of arrays of integrated circuit chips are possible (not shown). For example, the array could be two chips wide and four chips long (2×4), or the array could be one chip wide and eight chips long (1×8). Essentially, any combination of array dimensions is possible, however, to facilitate metallization, the arrays preferably have a non-square, rectangular peripheral shape.

In yet another embodiment of the present invention (not shown), metallization may be deposited on additional side faces (or end surfaces) of the electronic module. Each of these metallization patterns permits more complex interconnection among the chips of the electronic module. However, the additional process steps necessary to form such metallization adds costs. In particular, if additional (for example, a second) side surface metallization is used, the transfer metallurgy pattern on each array becomes more complex because it must connect to two array edges (corresponding to two side surfaces), as well as the I/O pads on the surfaces of the chips comprising the array. Nonetheless, a module formed with additional interconnection is more complex, more powerful, and simpler to interface with external circuitry.

In an alternate embodiment of the present invention, the size of the individual planar arrays within a module may be different. For example, in a module comprising mostly 1×4 arrays, an end array could be a 1×3 array. As another example, half of a "stack" could comprise 2×8 arrays and the other half 1×8 arrays. Added variety in the scope of useful modules is thus achieved.

Figure 6:
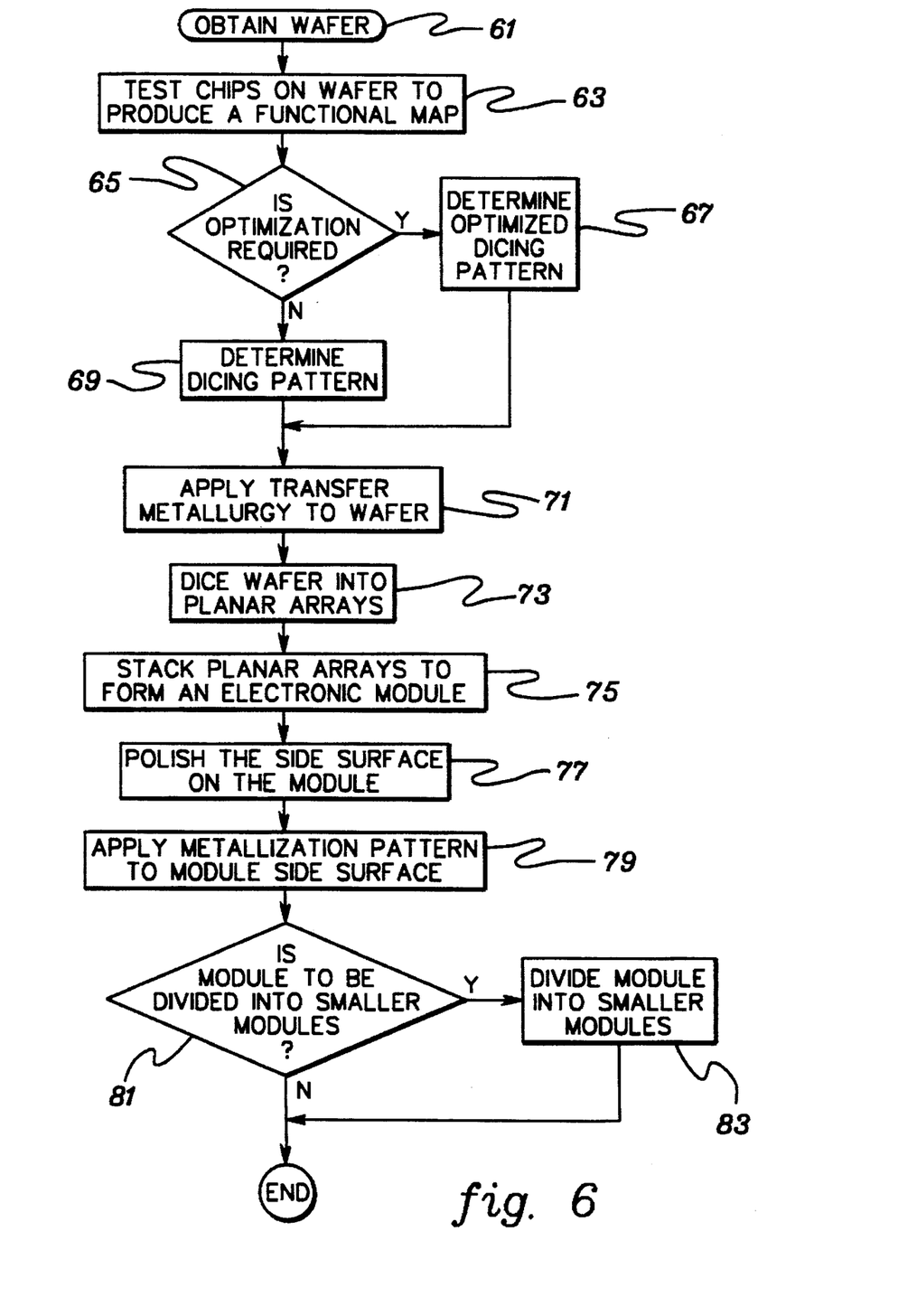
FIG. 6 is a flowchart of a preferred method for forming the electronic module of the present invention.

To summarize, the flow chart of FIG. 6 depicts a preferred method for forming the electronic module of the present invention. The method begins with the obtaining of a wafer (61) containing a plurality of IC chips. The chips on the wafer are then tested and a "functional map" is produced (63). Next, the wafer must next be diced in order to form planar arrays of IC chips, however, before dicing is performed, a dicing pattern must be determined. Based upon the size of the arrays as well as the functional map, a dicing pattern is established. If the total number of arrays obtainable from the wafer is desired to be optimized (65) then a manual or computer driven process may be used to determine an optimized dicing pattern (67). Otherwise, a dicing pattern is easily determined by looking for functional appropriately sized arrays of IC chips on the wafer (69).

Prior to actual dicing, transfer metallurgy is applied to the various IC chips on the wafer (71), however, this transfer metallurgy will be tailored to the dicing pattern determined. The transfer metallurgy generally extends towards an edge of each individual chip corresponding to an edge of the array. However, transfer metallurgy may be provided that extends to multiple array edges, in multiple directions, to facilitate additional interconnection. After the transfer metallurgy had been applied, the wafers are ready for dicing into planar arrays of IC chips, and are accordingly diced (73). Thus, a plurality of planar arrays, each comprising a plurality of IC chips have been formed.

An electronic module may now be assembled by stacking the planar arrays (75). A substantially planar surface of each array is adhesively secured to a substantially planar main surface of an adjacent array. Each array is thus substantially parallel to the next forming a substantially rectangular parallelepiped shaped electronic module.

Next, a side surface of the electronic module to which the transfer metals extend towards is polished (77) exposing the ends of the transfer metals. A metallization pattern is then applied (79) to the side surface, and electrically connected to the transfer metals. This metallization pattern provides interconnection between the IC chips of the planar arrays of the electronic module. As an optional process step, the electronic module may be further subdivided into smaller electronic modules (81). If subdivision is required, the modules are divided (83) into smaller modules along the kerf region between chips.

Figure 7A:
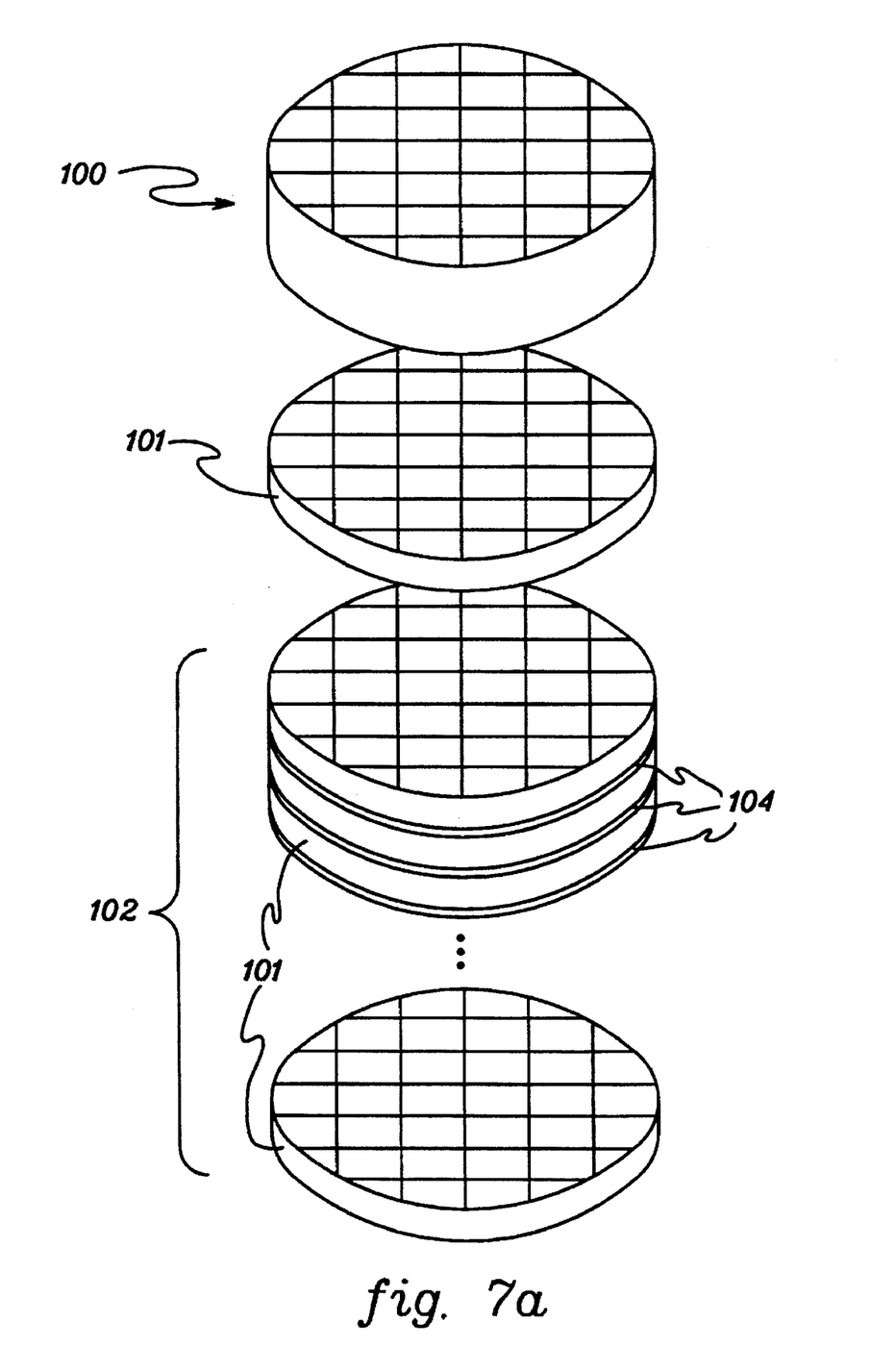
FIG. 7a is a perspective view of wafers being thinned and stacked to form a wafer stack in accordance with another processing embodiment of the present invention.
Figure 7B:
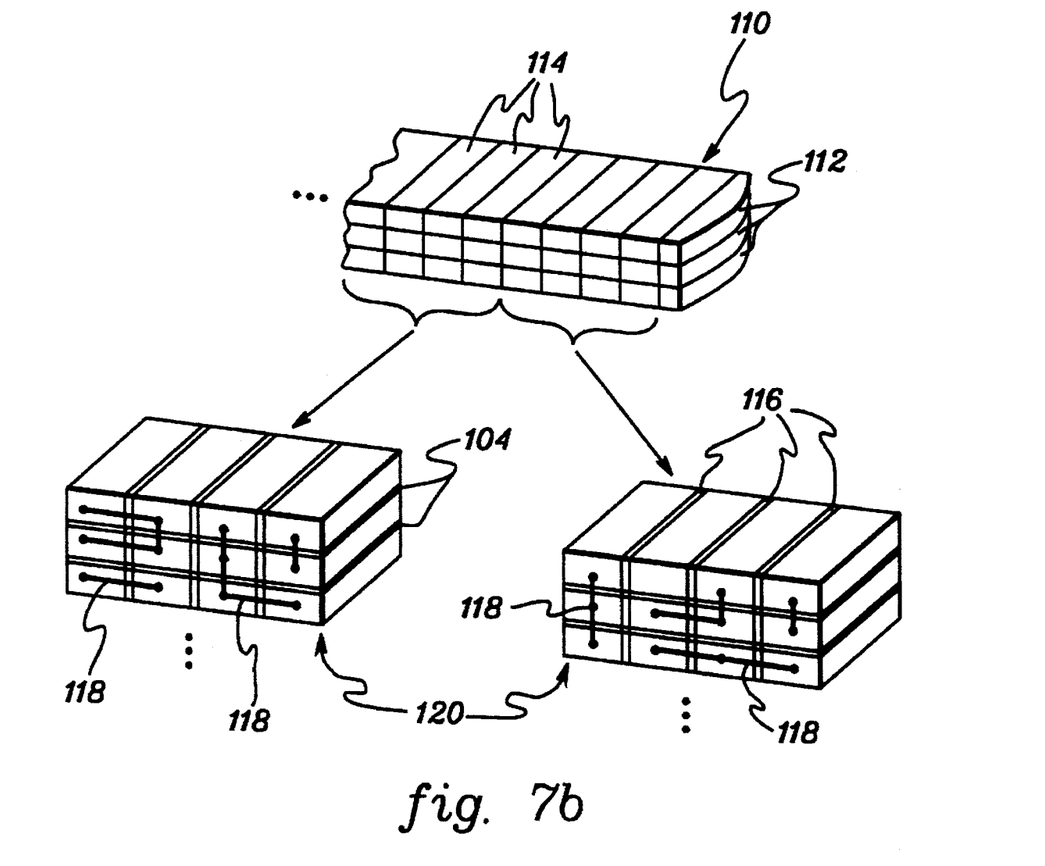
FIG. 7b is a perspective view of a stack of bar-shaped planar arrays obtained by dicing the wafer stack of FIG. 7a, and the resultant electronic sub-modules formed subsequent to metallization of at least one common face of the stacked planar arrays.

An alternate embodiment for forming an electronic module is presented below with reference to FIGS. 7a, 7b & 8. This process embodiment extends the concepts disclosed above a step further to attain additional cost savings. Referring first to FIGS. 7a & 7b, high yield wafers 100 are initially selected and, if desired, thinned using (for example) conventional back side grinding. In particular, the front of each wafer could be mounted on a support structure (not shown) and the back thinned. A wafer would then be added to the stack, aligned and given a partial cure to bond it to the wafer below. The support structure would then be removed and the next wafer added to the stack. Appropriate insulating and adhesive layers 104 are disposed intermediate the thinned wafers 101 in wafer stack 102.

Aligning, stacking and curing at the wafer level permits taking advantage of both the notch and wafer alignment marks. It also avoids difficultly inherent in handling and aligning individual chips. Further, the steps of stacking, aligning and curing all the chips at the wafer level at one time costs essentially the same as the cost for forming a single stack of separate chips.

As shown in the enlarged view of FIG. 7b, rows or columns of chips are then separated from the wafer stack to define electronic modules, such as electronic module 110, which may have been obtained by a lengthwise, one-dimensional dicing of the wafer stack. Within electronic module 110, multiple chips 114 are shown to be aligned in the different planar arrays 112 comprising module 110. Such a structure can be obtained by requiring that the wafers assembled in wafer stack 102 have identical die patterns formed therein. A non-square rectangular configuration for the planar arrays cut from the wafer stack is preferred as this configuration presents at least two face surfaces of the electronic module 110 upon which metallization 118 can be readily formed. Electronic sub-modules 120 are shown to have been formed from electronic module 110 by further dicing the module subsequent to provision of the metallization pattern 118 on the common face of the module. The common planar side surface of the module would have been etched and polished to expose the ends of the transfer metals as discussed above in connection with the other embodiments. Note that, interconnect metallization on this planar surface need not be identical between the different electronic sub-modules. For example, it may be desirable to omit connection to a chip in the stack which fails testing.

Alternate dicing schemes could also be used. For example, bar-shaped planar arrays could be diced from the wafer stack which are two chips wide and three or more chips long with interconnect wiring placed on both of the opposing main planar surfaces in the module. As a further variation, the electronic sub-modules 120 might be diced from electronic module 110 as more common multichip stacks wherein each chip layer of the stack comprises a single chip.

Figure 8:
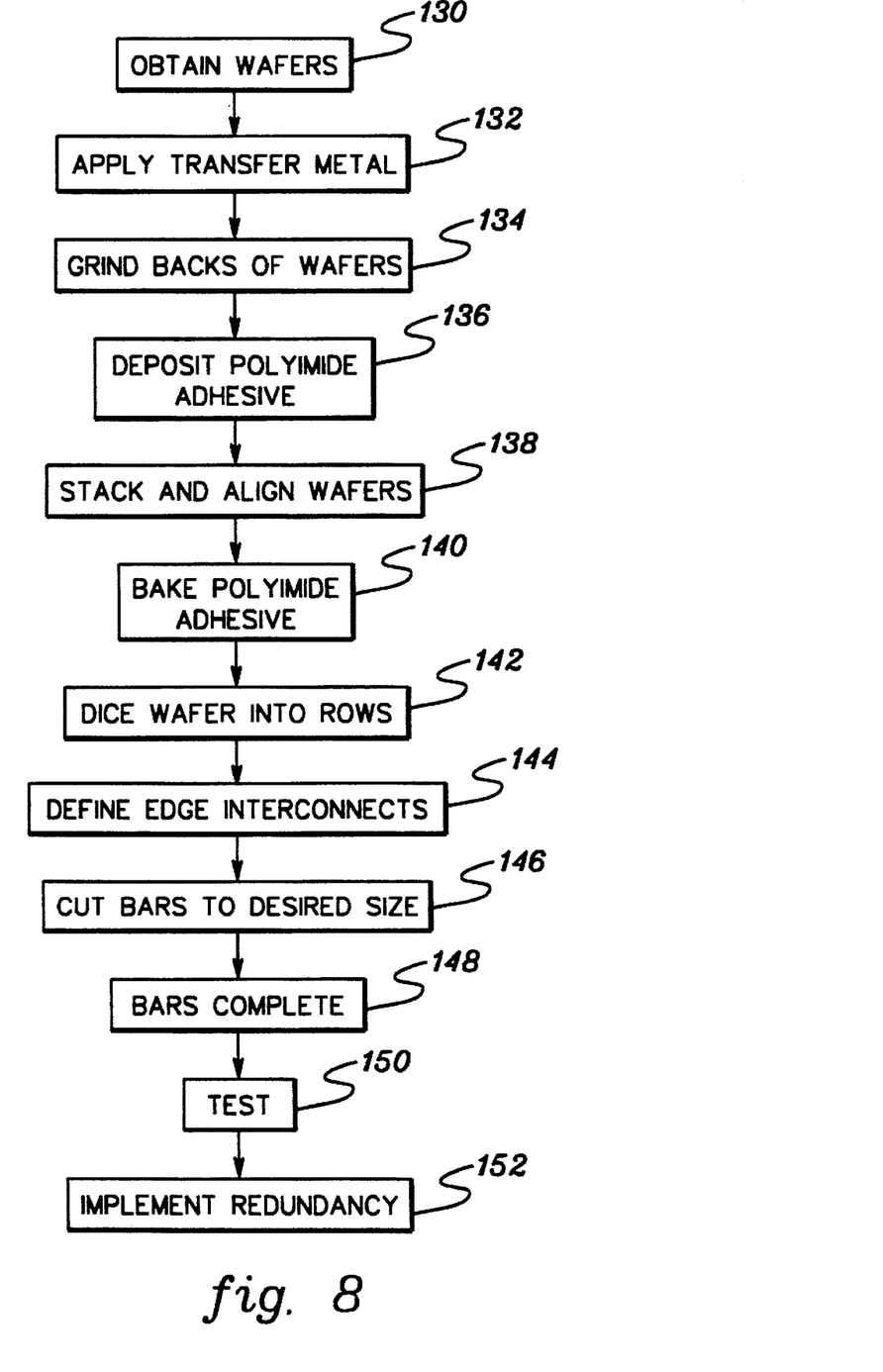
FIG. 8 is a flowchart of one embodiment of the stacked wafer fabrication process in accordance with the present invention for producing the desired electronic modules.

FIG. 8 presents an overview of a processing method in accordance with this aspect of the present invention. A plurality of wafers are obtained (130), and transfer metal is applied (132) to the individual chips of each planar array having the common, predefined peripheral shape (such as a non-square rectangle). The backs of the wafers can then be ground (134), if desired, and a polyimide adhesive layer deposited over the wafer (136). The individual wafers are stacked and aligned using the notch and wafer alignment marks (138) and the polyimide adhesive layer is baked (140) to secure the wafers together in the wafer stack. Partial curing of polyimide adhesive layers in a cube is described in commonly assigned, U.S. Pat. No. 5,478,781, entitled "Polyimide-Insulated Cube Package of Stacked Semiconductor Device Chips," which is hereby incorporated herein in its entirety. The mechanical, automatic tool which rotates wafers to alignment notches can be used to avoid any manual error. The wafers are placed one on top of the other in the aligned configuration. Rows or columns are next diced from the wafer stack depending upon the preferred final stack structure configurations (142). This forms different length planar arrays or bars with the largest bar comprising the center rows or center columns of the wafer stack. Interconnect wiring is then defined on a face of the resultant electronic module defined by the common edges of the planar arrays in the stack (144). Thereafter, the module can be further diced into electronic sub-modules of any desired size (146) which may comprise the completed product (148). Upon completion, the product is tested (150) and any built-in redundancy can be implemented by appropriately wiring or rewiring the sub-module as described above (152).

While the invention has been described in detail herein in accordance with certain preferred embodiments thereof, many modifications and changes therein may be effected by those skilled in the art. Accordingly, it is intended by the appended claims to cover all such modifications and changes as fall within the hue spirit and scope of the invention.

We claim:

1. A method for forming an electronic module comprising the steps of:
   (a) providing a plurality of wafers, each wafer having at least one planar array of multiple chips which has a peripheral shape;
   (b) forming a wafer stack by stacking the plurality of wafers so that the at least one planar array of multiple chips of each wafer having the predefined peripheral shape align within the wafer stack; and (c) dicing the wafer stack along the predefined peripheral shape.

2. The method of claim 1, wherein each planar array of multiple chips having the peripheral shape has an edge along said predefined peripheral shape, and wherein said method further comprises prior to said step (b) forming for each chip transfer metal connections to the edge defined along the predefined peripheral shape, and wherein said step (b) includes stacking the plurality of wafers so that the edges of the planar arrays of multiple chips containing transfer metal thereto within said wafer stack are aligned.

3. The method of claim 2, wherein after said dicing step (c), the edges of the planar arrays of multiple chips are aligned and form a common face of the electronic module, and wherein said method further comprises providing metallization on said common face to facilitate electrical connection to the chips in the electronic module.

4. The method of claim 3, wherein said providing of metallization includes providing contact pads electrically connected to transfer metals at said common face.

5. The method of claim 4, wherein said providing of metallization further comprises providing interconnect wiring on said common face to electrically interconnect chips of different planar arrays of chips disposed within the electronic module.

6. The method of claim 5, further comprising dicing the electronic module into multiple sub-modules, each sub-module comprising a plurality of chip layers, each chip layer containing at least one chip therein.

7. The method of claim 1, wherein the planar arrays of multiple chips define a common face of the electronic module subsequent to said dicing step (c), and wherein said method further comprises providing interconnect metallization on said common face subsequent to said dicing step (c).

8. The method of claim 7, further comprising dicing the electronic module into electronic sub-modules, each electronic sub-module comprising a plurality of chip layers which are at least partially interconnected by said interconnect metallization applied to the common face of the electronic module prior to said dicing thereof into said electronic sub-modules.

9. The method of claim 1, wherein each planar array of multiple chips comprises a plurality of integrated circuit (IC) chips, said IC chips having transfer wiring to a common edge disposed along said peripheral shape, and wherein said forming step (b) includes stacking the plurality of wafers such that the common edges of the planar arrays of multiple chips in different wafers align within the wafer stack.

10. The method of claim 1, wherein the predefined peripheral shape of each planar array of multiple chips comprises a non-square rectangular shape such that each planar array of chips comprises a bar-shaped planar array, and wherein said forming step (b) comprises stacking the plurality of wafers so that the bar-shaped planar arrays of different chips align within the wafer stack, and said dicing step (c) comprises dicing the wafer stack along the predefined peripheral shape such that the electronic module has two parallel edges.

11. The method of claim 1, wherein said providing step (a) includes providing the plurality of wafers such that each wafer has a plurality of bar-shaped planar arrays defined therein, said plurality of bar-shaped planar arrays being disposed identically in each wafer of the plurality of wafers, and wherein said dicing step (c) comprises dicing the wafer stack along the bar-shaped planar arrays in the wafer stack such that multiple electronic modules are formed.

12. The method of claim 11, wherein said dicing of said electronic module comprises dicing said electronic module such that each electronic sub-module formed has a plurality of chip layers with each chip layer having only one chip therein.

13. The method of claim 1, wherein said forming step (b) includes bonding the plurality of wafers together to form said wafer stack.

14. The method of claim 1, further comprising prior to said forming step (b), thinning each wafer of said plurality of wafers.

15. The method of claim 1, wherein said providing step (a) comprises testing each wafer for functionality and selecting only wafers for said forming step (b) having functional chips within said at least one planar array of multiple chips.

16. The method of claim 1, wherein each planar array of multiple chips having the peripheral shape has two opposing edges along said predefined peripheral shape, and wherein said step (c) includes dicing the wafer stack along the two opposing edges of the predefined peripheral shape.

* * * * *

UNITED STATES PATENT AND TRADEMARK OFFICE
CERTIFICATE OF CORRECTION

PATENT NO. : 5,656,553
DATED : August 12, 1997
INVENTOR(S) : Leas et al.

It is certified that error appears in the above-identified patent and that said Letters Patent is hereby corrected as shown below:

| | |
|---|---|
| Title Page, [63], and Col. 1, line 8 | "Ser. No. 239,991" should read —Ser. No. 293,991—. |
| Claim 1, column 8, line 66, | Delete "predefined". |
| Claim 1, column 9, line 1, | Delete "predefined". |
| Claim 2, column 9, line 5, | Delete "predefined". |
| Claim 2, column 9, line 8, | Delete "predefined". |
| Claim 10, column 10, line 5, | Delete "predefined". |
| Claim 10, column 10, lines 12-13, | Delete "predefined". |
| Claim 16, column 10, line 40, | Delete "predefined". |
| Claim 16, column 10, line 42, | Delete "predefined". |

Signed and Sealed this

Eighth Day of June, 1999

Attest:

Attesting Officer

Q. TODD DICKINSON

Acting Commissioner of Patents and Trademarks